US010665755B2

(12) United States Patent
Chen

(10) Patent No.: US 10,665,755 B2
(45) Date of Patent: May 26, 2020

(54) METHOD FOR MANUFACTURING LIGHT EMITTING DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/416,265

(22) Filed: May 19, 2019

(65) Prior Publication Data

US 2019/0288162 A1    Sep. 19, 2019

Related U.S. Application Data

(62) Division of application No. 15/925,744, filed on Mar. 19, 2018, now Pat. No. 10,340,421.

(51) Int. Cl.
*H01L 33/38* (2010.01)
*H01L 21/02* (2006.01)
*H01L 33/00* (2010.01)
*H01L 33/08* (2010.01)

(52) U.S. Cl.
CPC ...... *H01L 33/387* (2013.01); *H01L 21/02647* (2013.01); *H01L 33/0075* (2013.01); *H01L 33/08* (2013.01)

(58) Field of Classification Search
None
See application file for complete search history.

(56) References Cited

U.S. PATENT DOCUMENTS

| 9,385,267 | B2* | 7/2016 | Chen | H01L 33/44 |
| 10,158,043 | B2* | 12/2018 | Chen | H01L 33/14 |
| 10,199,532 | B1* | 2/2019 | Chen | H01L 33/0045 |
| 2004/0051107 | A1 | 3/2004 | Nagahama et al. | |
| 2004/0072383 | A1 | 4/2004 | Nagahama et al. | |
| 2010/0065861 | A1 | 3/2010 | Nagai | |
| 2014/0077223 | A1 | 3/2014 | Choe et al. | |
| 2016/0064594 | A1* | 3/2016 | Chen | H01L 33/44 257/94 |
| 2017/0179340 | A1* | 6/2017 | Chen | H01L 33/145 |

* cited by examiner

*Primary Examiner* — Telly D Green
(74) *Attorney, Agent, or Firm* — CKC & Partners Co., LLC

(57) ABSTRACT

A method for manufacturing a light emitting device is provided. The method includes: preparing a growth substrate with at least one dislocation-controlling feature thereon; sequentially growing a second type semiconductor layer, an active layer, and a first type semiconductor layer on the dislocation-controlling feature, wherein the active layer has a first region and at least one second region, and the dislocation-controlling feature causes a threading dislocation density of the first region to be greater than a threading dislocation density of the second region; and modifying a resistivity of the first type semiconductor layer, so that the resistivity of the first type semiconductor layer increases from a plurality of low resistance portions toward a high resistance portion of the first type semiconductor layer.

4 Claims, 9 Drawing Sheets

METHOD FOR MANUFACTURING LIGHT EMITTING DEVICE

CROSS-REFERENCE TO RELATED APPLICATION

The present application is a Divisional Application of U.S. application Ser. No. 15/925,744, filed Mar. 19, 2018, which is herein incorporated by reference.

BACKGROUND

Field of Invention

The present disclosure relates to a method for manufacturing a light emitting device.

Description of Related Art

The statements in this section merely provide background information related to the present disclosure and do not necessarily constitute prior art.

In recent years, micro light emitting devices have become popular in general and commercial lighting applications. As light sources, LEDs have many advantages including low energy consumption, long lifetime, small size, and fast switching, and hence conventional lighting, such as incandescent lighting, is gradually replaced by LED lights. These properties are promising for applications on displays.

The efficiency of LEDs relates to threading dislocation defects typically caused by a mismatch between different lattice constants and different thermal expansion coefficients belonging to a growth substrate and growth alloys respectively. Threading dislocation defects within emitting areas of LEDs reduce efficiency and stability thereof.

Besides, since a current density is approximately an exponential function of voltage near the threshold for an LED, it is difficult to control a current value.

SUMMARY

According to some embodiments of the present disclosure, a method for manufacturing a light emitting device is provided. The method includes: preparing a growth substrate with at least one dislocation-controlling feature thereon; sequentially growing a second type semiconductor layer, an active layer, and a first type semiconductor layer on the dislocation-controlling feature, wherein the active layer has a first region and at least one second region, and the dislocation-controlling feature causes a threading dislocation density of the first region to be greater than a threading dislocation density of the second region; and modifying a resistivity of the first type semiconductor layer, so that the resistivity of the first type semiconductor layer increases from a plurality of low resistance portions toward a high resistance portion of the first type semiconductor layer.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
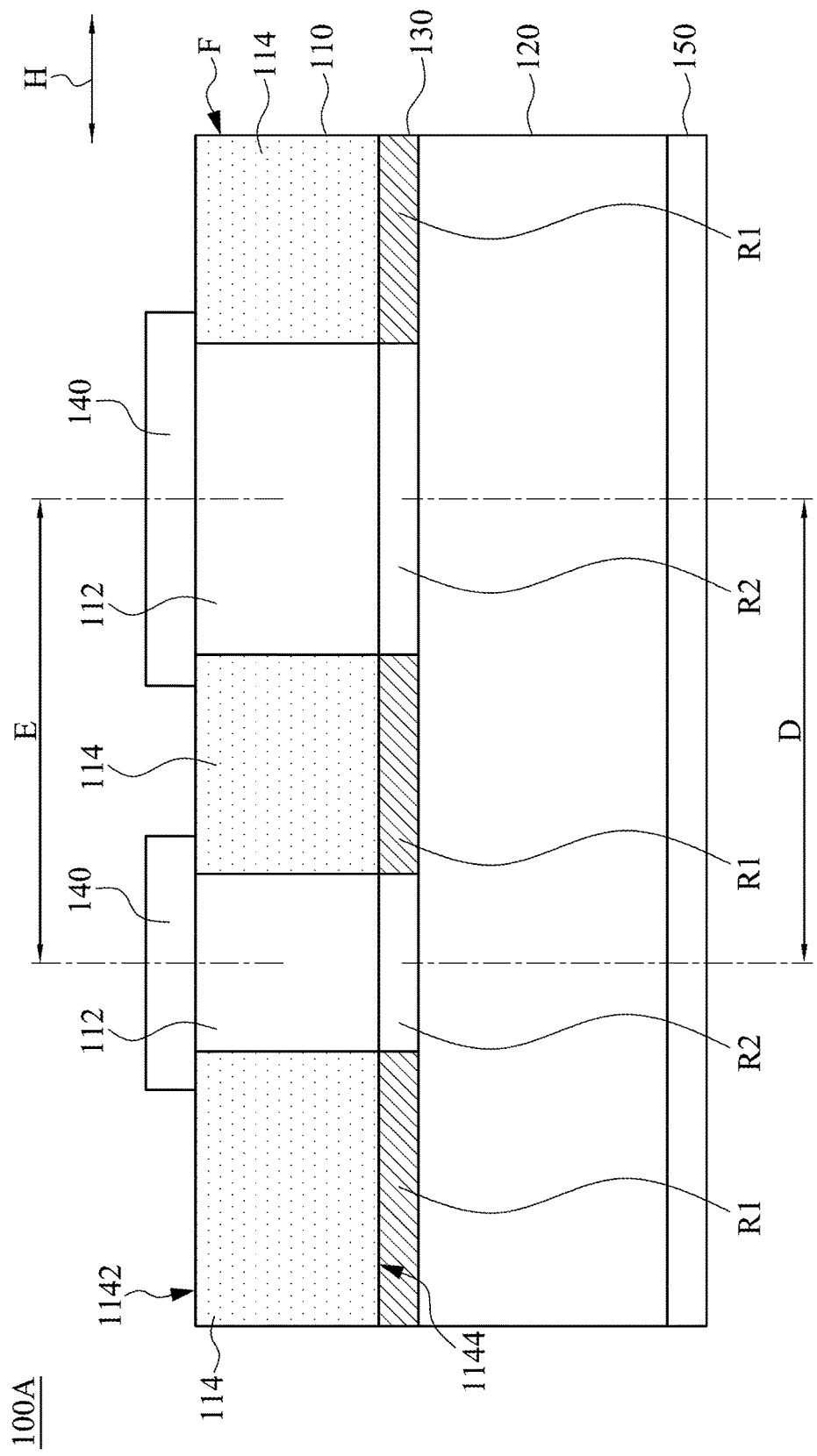
FIG. 1A is a schematic cross-sectional view of a light emitting device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 1B:
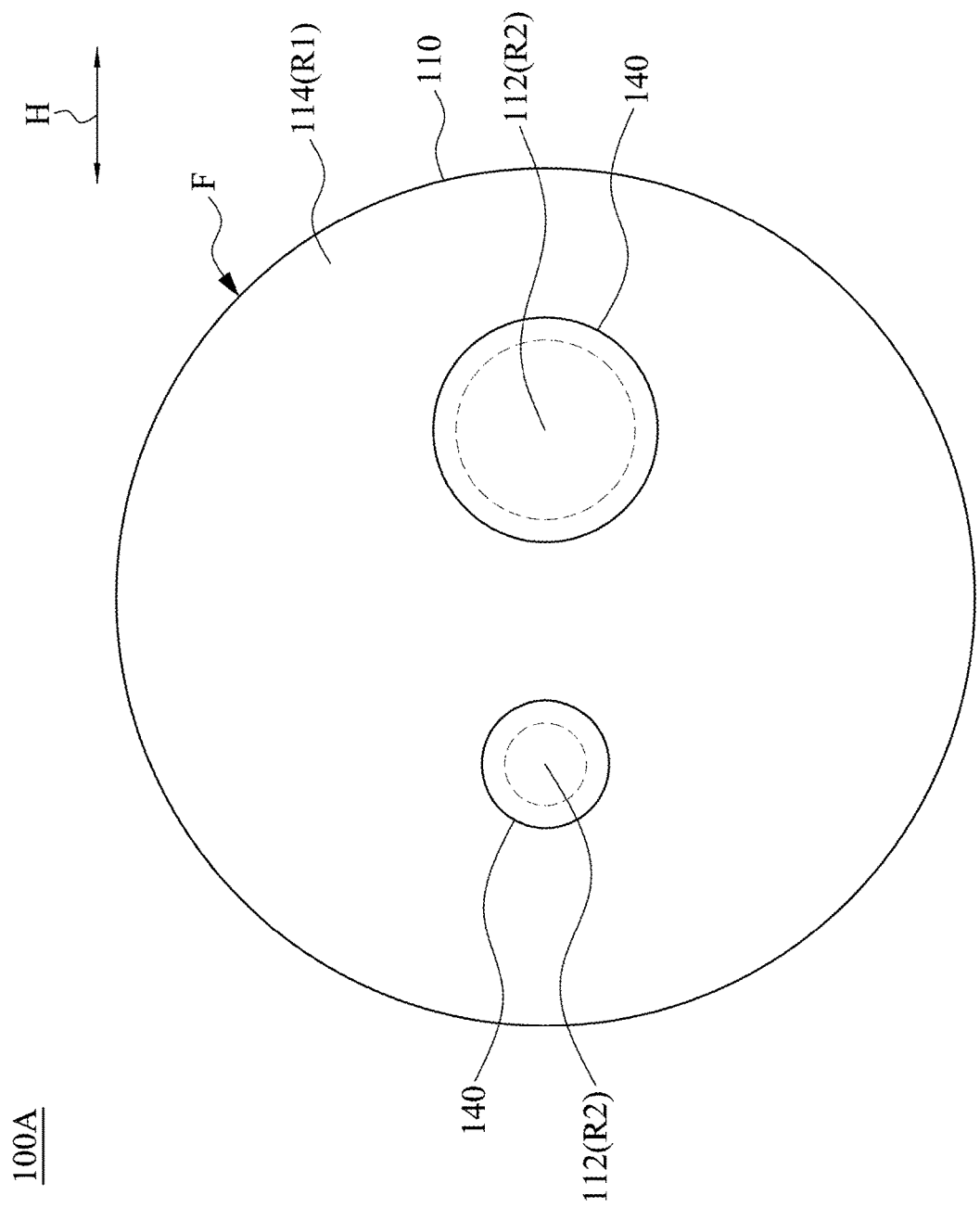
FIG. 1B is a schematic top view of a light emitting device according to some embodiments of the present disclosure.

In one aspect, a light emitting device is provided. References are made to FIGS. 1A and 1B. FIG. 1A is a schematic cross-sectional view of a light emitting device 100A according to some embodiments of the present disclosure. FIG. 1B is a schematic top view of a light emitting device 100A according to the embodiments illustrated by FIG. 1A. According to some embodiments of the present disclosure, a light emitting device 100A including a first type semiconductor layer 110, a second type semiconductor layer 120, an active layer 130, a plurality of first electrodes 140, and a second electrode 150 is provided. The light emitting device 100A may be a light emitting diode, but should not be limited thereto.

In some embodiments, the first type semiconductor layer 110 is made of a p-type semiconductor material, and the second type semiconductor layer 120 is made of an n-type semiconductor material. In some embodiments, the first type semiconductor layer 120 is made of p-doped AlGaN/InGaN/GaN, or InGaAlP. Hydrogen gas may be used in the formation of the first type semiconductor layer 110, and hydrogen atoms may present in the first type semiconductor layer 110.

The first type semiconductor layer 110 includes a plurality of low resistance portions 112 and a high resistance portion 114. The low resistance portions 112 are isolated from one another by the high resistance portion 114 such as the embodiments shown in FIG. 1B. The active layer 130 is present between the first type semiconductor layer 110 and the second type semiconductor layer 120. The active layer 130 includes a first region R1 and at least one second region R2. In some embodiments, a number of at least one second region R2 is plural. In some embodiments, a threading dislocation density of the first region R1 is greater than a threading dislocation density of the second region R2, and a vertical projection of at least one of the low resistance portions 112 on the active layer 130 at least partially overlaps with the second region R2.

A distance D between adjacent two of the second regions R2 may be equal or not equal to a distance between another adjacent two of the second regions R2. Specifically, the distance D may be determined by a distribution of dislocation-controlling features when the light emitting device 100A is grown, but should not be limited thereto. An extending direction of the distance D is defined as a horizontal direction H which is parallel to a growth plane as shown in FIGS. 1A and 1B. The distance D is defined as a distance between two centers respectively belonging to said adjacent two second regions R2.

In some embodiments, the distance D between said adjacent two second regions R2 is equal to a distance E between two of the low resistance portions 112, such that a vertical projection of at least one of said two of the low resistance portions 112 on the active layer 130 is partially or even completely overlaps with one of said adjacent two second regions R2. Specifically, the distance E is defined as a distance between two local minimal resistivities respectively belonging to said two of the low resistance portions 112. Accordingly, current flowing through the light emitting device 100A will mainly flow through the low resistance portions 112 of the first type semiconductor layer 110 and the second regions R2 of the active layer 130, so as to enhance the external quantum efficiency (i.e., a multiplication between injection efficiency, internal quantum efficiency, and optical extraction efficiency).

In some embodiments, at least one of the low resistance portions 112 is separated from an outer edge F of the first type semiconductor layer 110 and enclosed by the high resistance portion 114. In some embodiments, a plurality of first electrodes 140 are electrically connected to the low resistance portions respectively, and each of the first electrodes 140 is electrically isolated from one another, such that voltages of each of the first electrodes 140 may be applied individually. In some embodiments, a second electrode 150 is electrically connected to the second type semiconductor layer 120. As such, a plurality of low resistance portions 112 of the first type semiconductor layer 110 with a plurality of electrically isolated first electrodes 140, a common second type semiconductor layer 120, and a common second electrode 150 enable a digital control on a single light emitting device 100A. The single light emitting device 100A may act as multiple light emitting diodes.

Besides correspondences between some low resistance portions 112 of the first semiconductor layer 110 and some second regions R2 of the active layer 130 illustrated in some embodiments mentioned above, there may also be correspondences between the high resistance portion 114 and the first region R1. In some embodiments, a vertical projection of the high resistance portion 114 on the active layer 130 at least partially overlaps with the first region R1.

Regarding a spatial dependent variation on a resistivity of the first type semiconductor layer 110, the resistivity of the first type semiconductor layer 110 increases from each of the low resistance portions 112 toward the high resistance portion 114. Specifically, in some embodiments, the resistivity of the first type semiconductor layer 110 horizontally increases from each of the low resistance portions 112 toward the high resistance portion 114. The horizontal direction described herein may be the same as the horizontal direction H mentioned above. Said horizontal direction H may also be a direction parallel to an interface extending direction between the first type semiconductor layer 110 and the active layer 130 or that between the active layer 130 and the second type semiconductor layer 120, as illustrated in FIGS. 1A and 1B.

In some embodiments as shown in FIG. 1A, the high resistance portion 114 has a top surface 1142 facing away from the active layer 130, and a resistivity of a portion of the high resistance portion 114 near the top surface 1142 is greater than a resistivity of a portion of the high resistance portion 114 near a side 1144 close to the active layer 130. Changes in resistivity described herein may be modified by, such as, diffusion or doping, so that the resistivity of the high resistance portion 114 decreases continuously from the top surface 1142 toward the active layer 130. Specifically, the diffusion may be performed by depositing a metal on the top surface 1142 of the high resistance portion 114 and optionally heating. The metal may be Ti or Si, but should not be limited thereto. Doping may be performed from one side of the high resistance portion 114, such as doping from the top surface 1142, but should not be limited thereto. In such a case, the resistivity near the top surface 1142 reveals higher than that near a side 1144. In some other embodiments, a resistivity of a portion of the high resistance portion 114 near the top surface 1142 is equal to a resistivity of a portion of the high resistance portion 114 near the side 1144. In some other embodiments, the modification of resistivity of the first type semiconductor layer 110 may also be performed by selective activation with assistance by patterned metal (e.g. Ni) and gas (e.g. $NH_3$) injection, by selective activation with assistance by e-beam/laser/UV-irradiation to eliminate hydrogen in the first type semiconductor layer 110, or by selective activation with assistance by Ni as a catalyst and then heating to about 450° C. Details of which will not be described herein.

Figure 2:
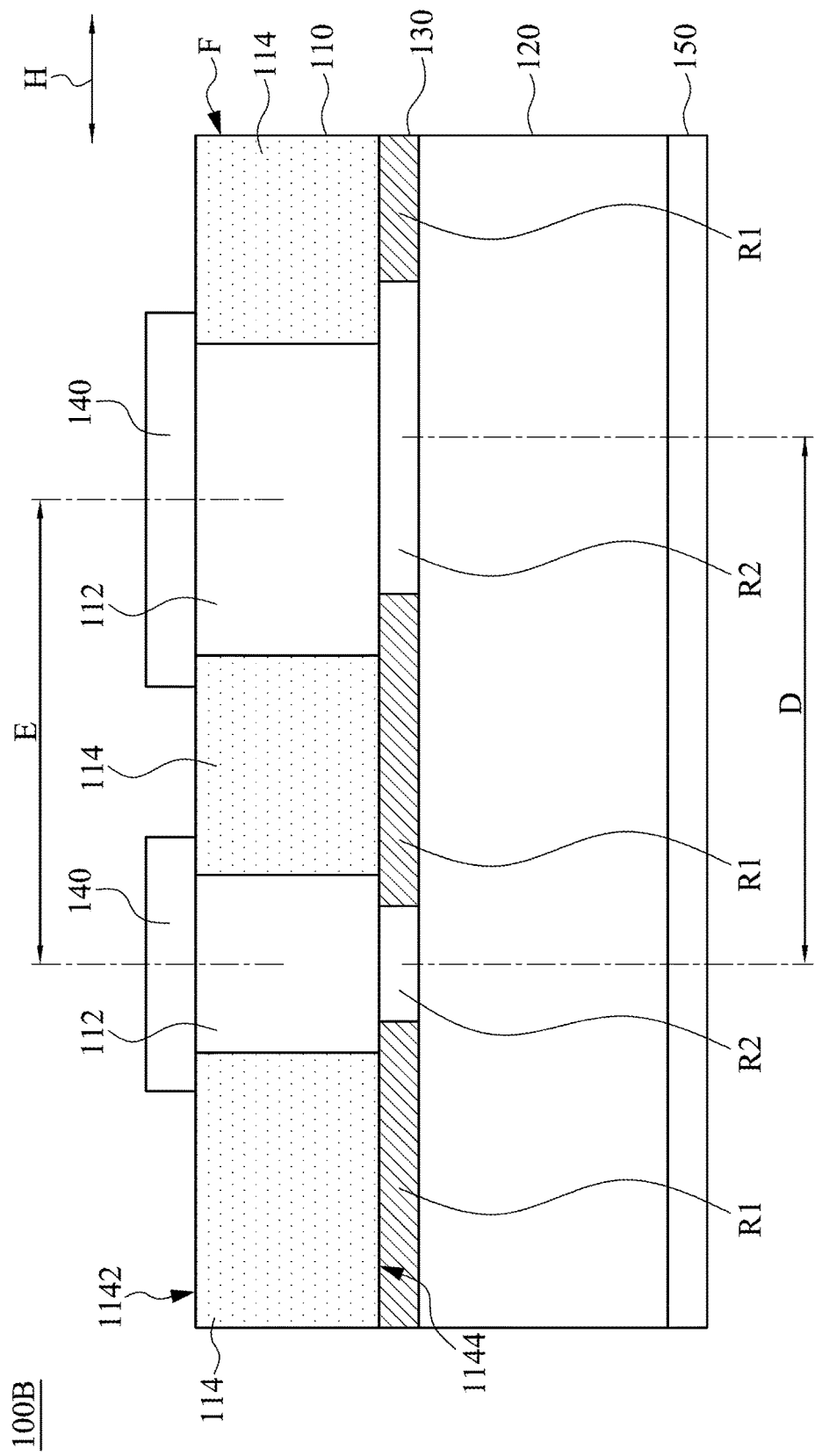
FIG. 2 is a schematic cross-sectional view of a light emitting device according to some embodiments of the present disclosure.
Figure 3:
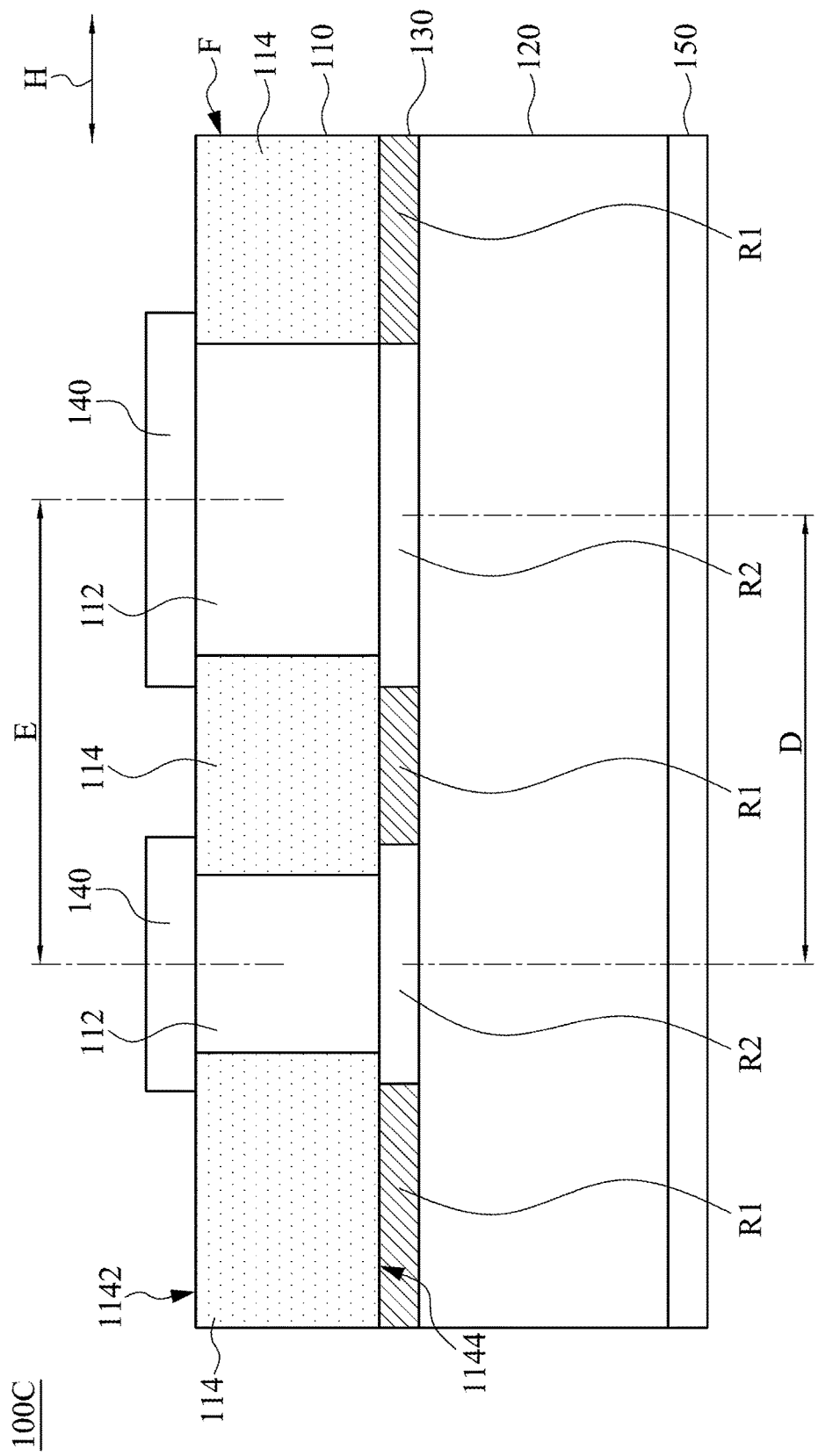
FIG. 3 is a schematic cross-sectional view of a light emitting device according to some embodiments of the present disclosure.

Reference is made to FIGS. 2 and 3. FIG. 2 is a schematic cross-sectional view of a light emitting device 100B according to some embodiments of the present disclosure. FIG. 3 is a schematic cross-sectional view of the light emitting device 100C according to some embodiments of the present disclosure. Differences among the embodiments of FIGS. 1 to 3 relate to a range of the vertical projection of low resistance portions 112 on the active layer 130. In some embodiments illustrated by FIG. 2, a vertical projection of one of the low resistance portions 112 on the active layer 130 overlaps with a whole one of the second regions R2 and two parts of the first region R1, and a vertical projection of another one of the low resistance portions 112 on the active layer 130 overlaps with a part of another second region R2 and a part of the first region R1. In some embodiments illustrated by FIG. 3, a vertical projection of one of the low resistance portions 112 on the active layer 130 overlaps with a portion within one of the second regions R2, and a vertical projection of another one of the low resistance portions 112 on the active layer 130 overlaps with a part of another second regions R2.

Figure 4:
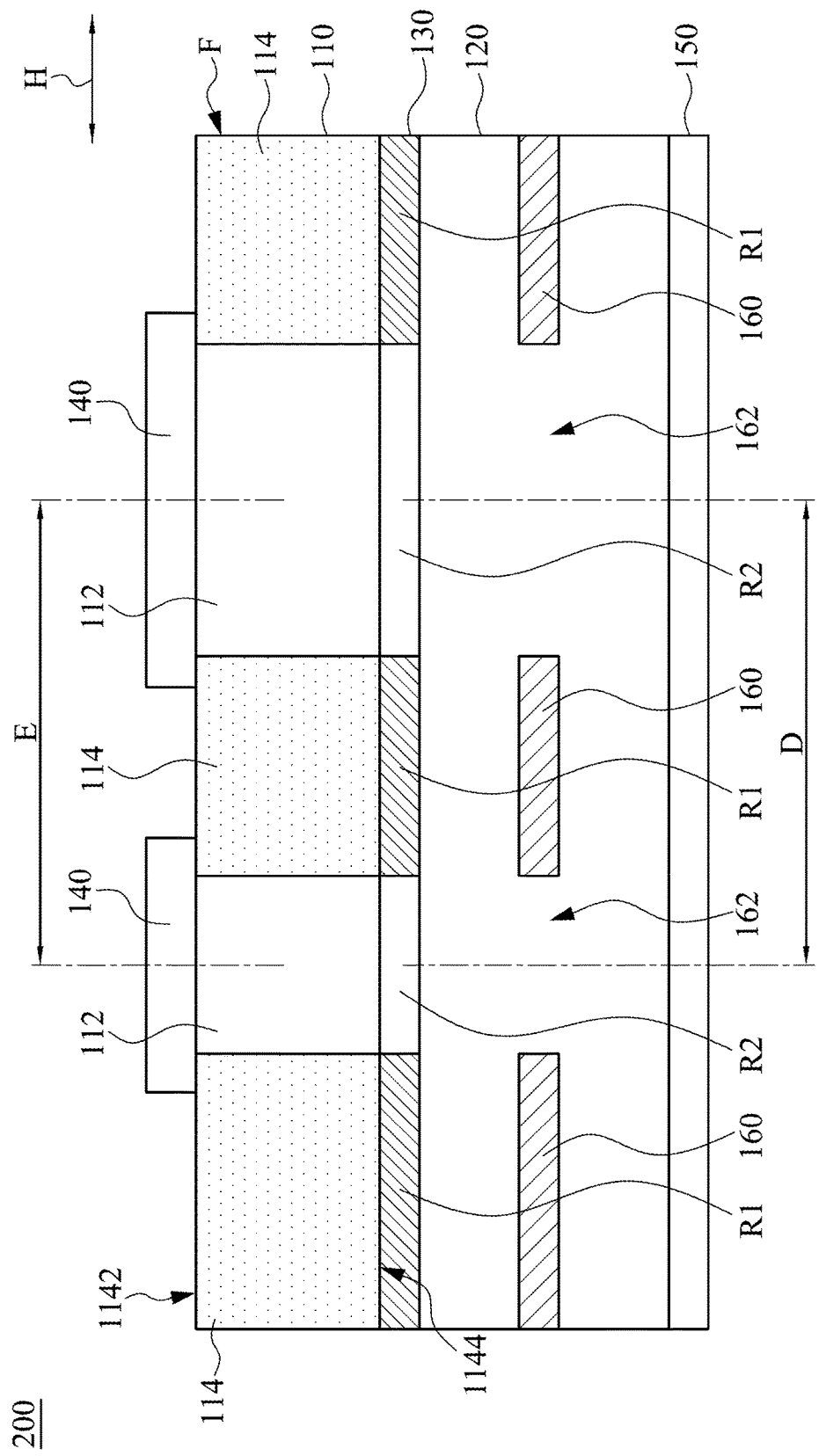
FIG. 4 is a schematic cross-sectional view of a light emitting device according to some embodiments of the present disclosure.

Reference is made to FIG. 4. FIG. 4 is a schematic cross-sectional view of a light emitting device 200 according to some embodiments of the present disclosure. A difference between embodiments illustrated by FIG. 4 and those illustrated by FIG. 1A is that the light emitting device 200 further includes a current control layer 160 compared to the light emitting device 100A. The current control layer 160 is present between the first electrodes 140 and the second electrode 150, and the current control layer 160 has a plurality of openings 162 thereon. The current control layer 160 may be made of dielectric materials, but should not be limited thereto. In some embodiments, a vertical projection of one of the openings 162 on the active layer 130 at least partially overlaps with a vertical projection of one of the low resistance portions 112 on the active layer 130 and one of the second regions R2. In some other embodiments, there may be a plurality of current control layers 160 present within/on the first type semiconductor layer 110, the second type semiconductor layer 120, or the combination thereof. The current control layers 160 may also present on an interface between the first type semiconductor layer 110 and the active layer 130, an interface between the active layer 130 and the second type semiconductor layer 120, and an interface between the second type semiconductor layer 120 and the second electrode 150.

Figure 5:
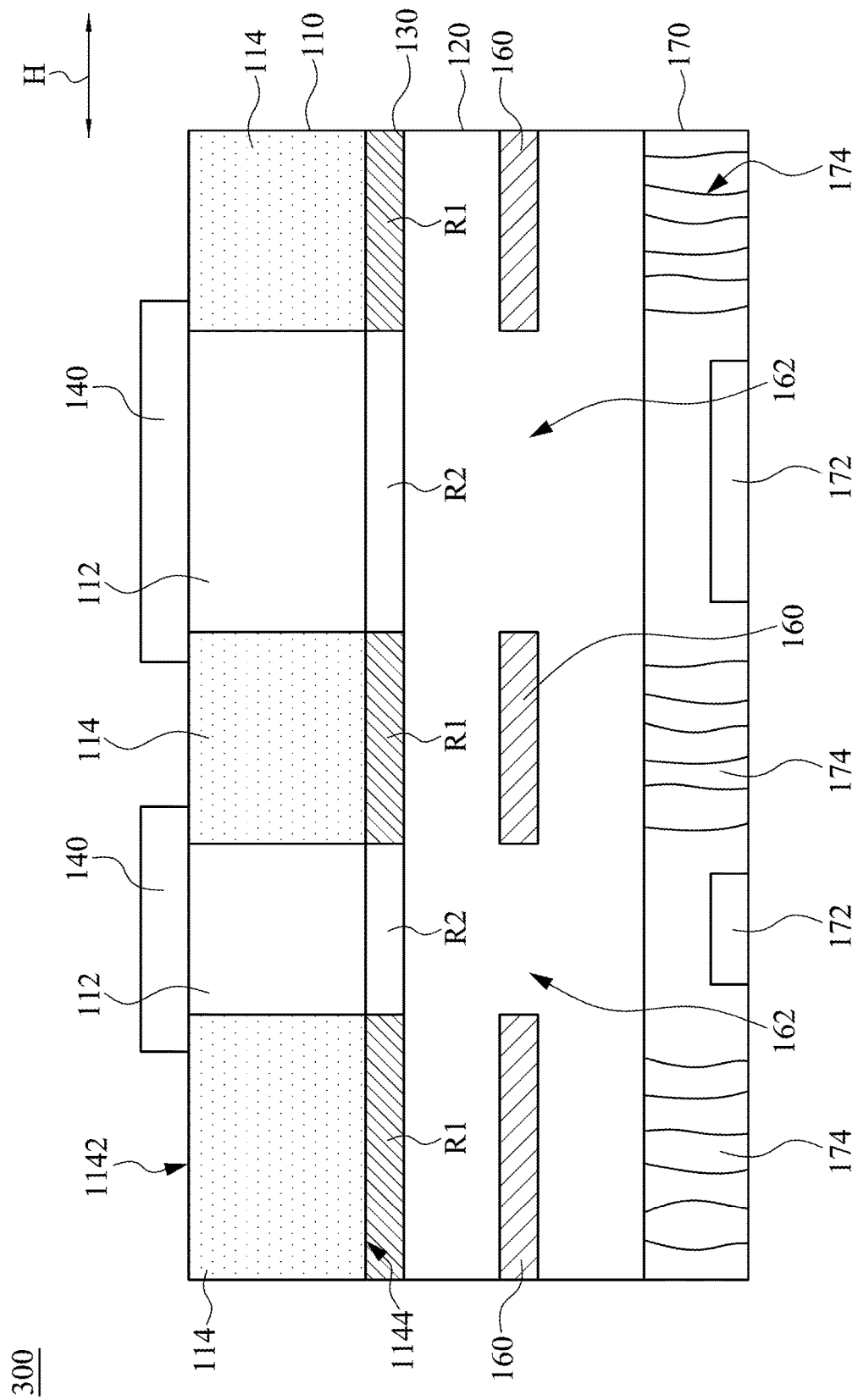
FIG. 5 is a schematic cross-sectional view of a light emitting device according to some embodiments of the present disclosure.

Reference is made to FIG. 5. FIG. 5 is a schematic cross-sectional view of a light emitting device 300 according to some embodiments of the present disclosure. A difference between embodiments illustrated by FIG. 5 and those illustrated by FIG. 4 is that the light emitting device 300 further includes an epitaxial lateral overgrowth (ELOG) layer 170 compared to the light emitting device 200. The second type semiconductor layer 120 is present between the active layer 130 and the ELOG layer 170. In some embodiments, at least one dislocation-controlling feature 172 is present in the ELOG layer 170. The dislocation-controlling feature 172 may be conductive, or conductive and reflective in the visible region. In some embodiments, a vertical projection of at least one of the dislocation-controlling features 172 on the first type semiconductor layer 110 at least partially overlaps with one of the low resistance portions 112. Specifically, the dislocation-controlling features 172 can block threading dislocations 174 from growing up to the active layer 130, such that the vertical projection of at least one of the dislocation-controlling features 172 on the active layer 130 at least partially overlaps with a second region R2 which has lower threading dislocation density compared to the first regions R1. In other words, the second regions R2 can have higher injection efficiency (i.e., a proportion of electrons passing through a light emitting device that are injected into the active layer 130) and higher internal quantum efficiency (i.e., a proportion of electron-hole recombinations in the active layer 130 that are electron-hole radiative recombinations).

Figure 6:
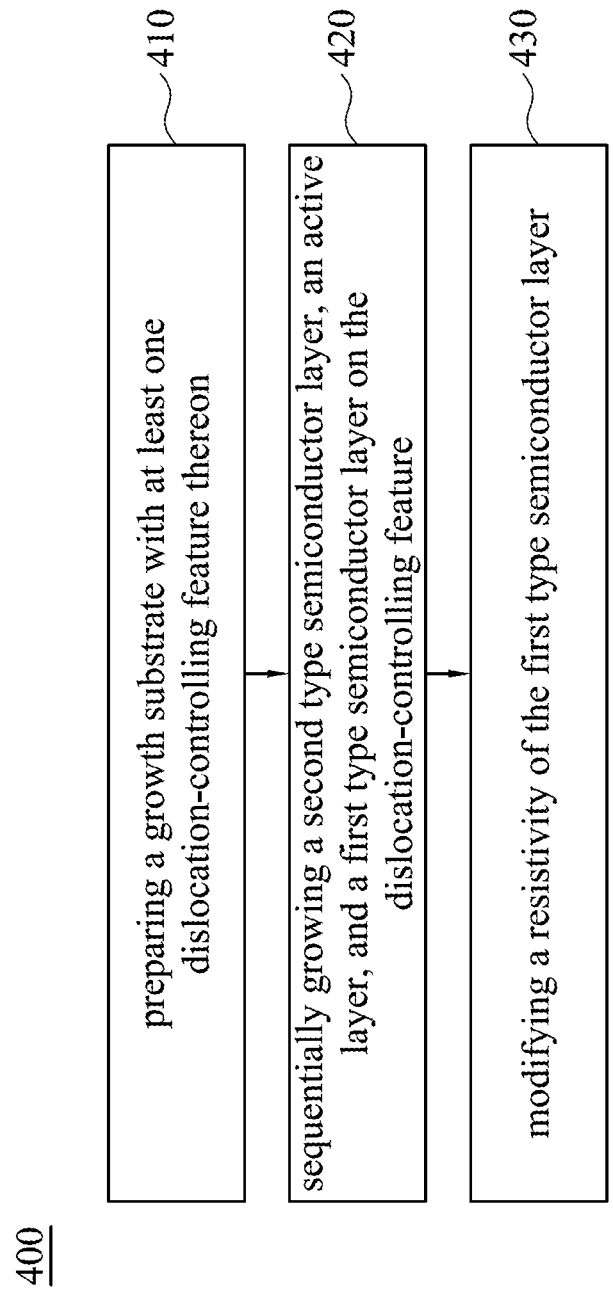
FIG. 6 is a schematic flow chart of a method for manufacturing a light emitting device.
Figure 7:
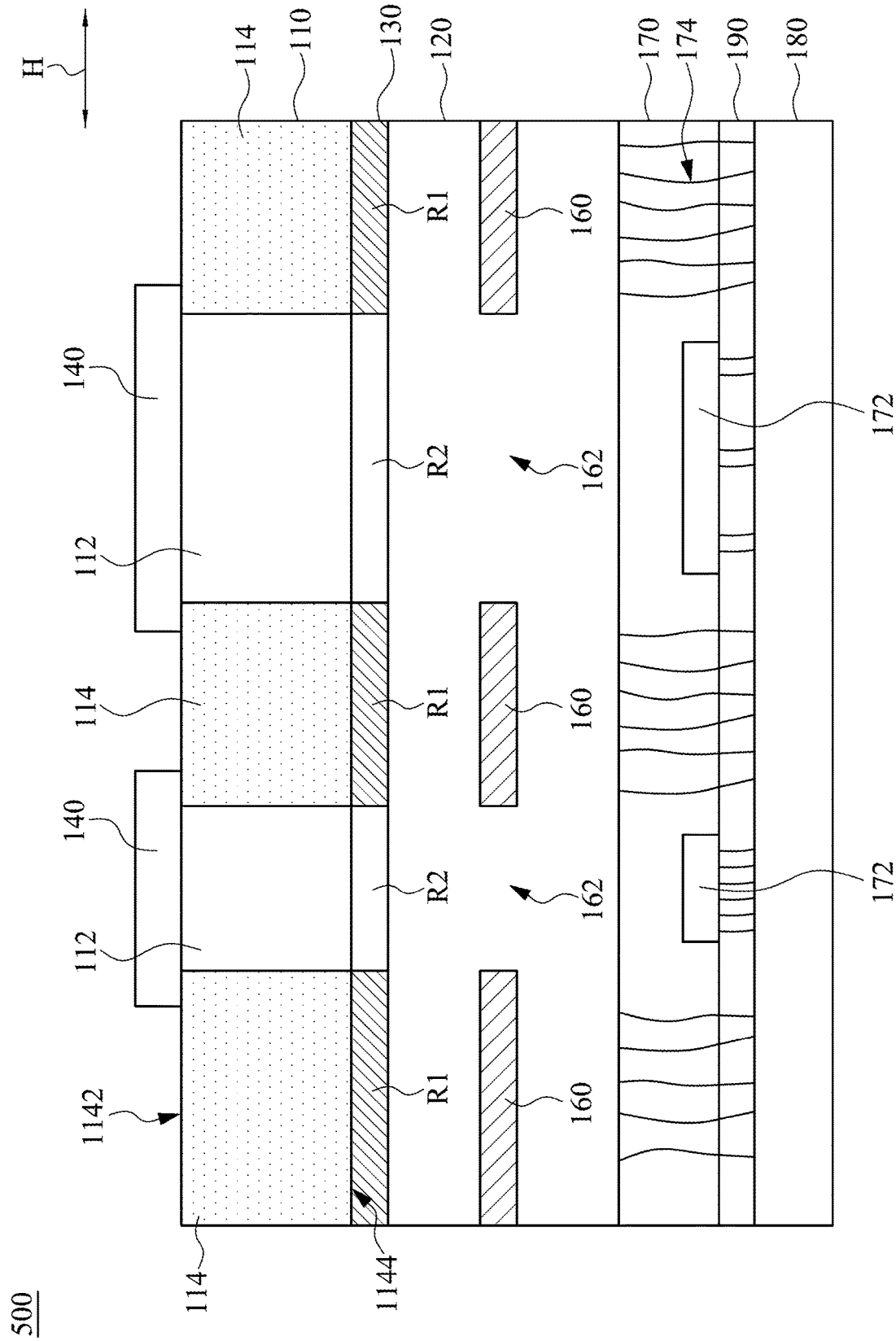
FIG. 7 is a schematic cross-sectional view of a light emitting device without removing a growth substrate formed by a method for manufacturing a light emitting device according to some embodiments of the present disclosure.
Figure 8:
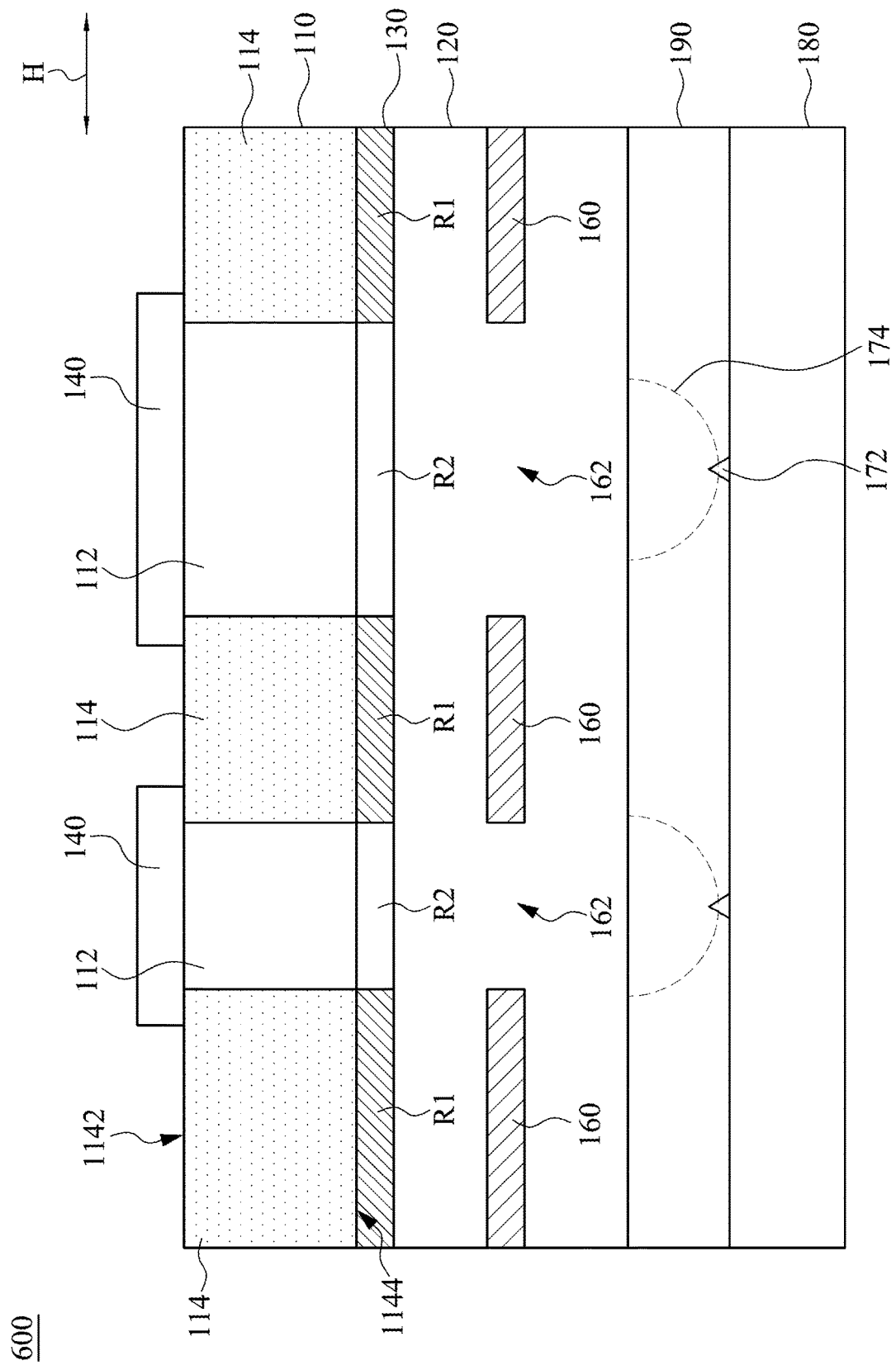
FIG. 8 is a schematic cross-sectional view of a light emitting device without removing a growth substrate formed by a method for manufacturing a light emitting device according to some embodiments of the present disclosure.

In another aspect, a method for manufacturing a light emitting device is provided. Reference is made to FIGS. 6 to 8. FIG. 6 is a schematic flow chart of a method 400 for manufacturing a light emitting device. FIG. 7 is a schematic cross-sectional view of a light emitting device 500 without removing a growth substrate formed by the method illustrated by FIG. 6 according to some embodiments of the present disclosure. FIG. 8 is a schematic cross-sectional view of a light emitting device 600 without removing a growth substrate formed by the method illustrated by FIG. 6 according to some embodiments of the present disclosure.

The method 400 begins with operation 410 in which a growth substrate 180 with at least one dislocation-controlling feature 172 thereon is prepared. In some embodiments, a buffer layer 190 is formed between the growth substrate 180 and a plurality of dislocation-controlling features 172, such as those can be illustrated by FIG. 7. In the embodiments, each of the dislocation-controlling features 172 is a dislocation-blocking feature (FIG. 7), and is configured to block the growth of the threading dislocations 174. Then, an epitaxial lateral overgrowth (ELOG) layer 170 is formed on the buffer layer 190 and the dislocation-controlling features 172. In some embodiments, the ELOG layer 170 may be formed by epitaxy along the horizontal direction H (parallel to the growth substrate 180). In some embodiments, when the buffer layer 190 and the growth substrate 180 are made of different materials, it is apt to have different thermal expansion coefficients and lattice constants between the buffer layer 190 and the growth substrate 180, such that a plurality of threading dislocations 174 arise from the growth substrate 180 into the buffer layer 190. Accordingly, due to dislocation-blocking features (i.e., the dislocation-controlling features 172 in FIG. 7), the threading dislocations 174 do not grow into some portions of the ELOG layer 170 present above the dislocation-blocking features.

In the above embodiments, the growth substrate 180 may be a bulk substrate including sapphire ($Al_2O_3$). In alternative embodiments, the growth substrate 180 may be formed of other suitable materials such as, Si, GaN, SiC, or GaAs. In some embodiments, the buffer layer 190 may be made of a material different from or the same as the growth substrate 180. In some embodiments, the buffer layer 190 may be a III-V compound semiconductor layer such as GaN, InN, AlN, InGaN, AlGaN, InAlGaN, AlGaInP, or combinations thereof.

In some other embodiments, the dislocation-controlling feature 172 is present between the growth substrate 180 and the buffer layer 190, such as those can be illustrated by FIG. 8. The dislocation-controlling features 172 are formed on the growth substrate 180, in which each of the dislocation-controlling features 172 is a dislocation-reduction feature (FIG. 8). A buffer layer 190 is formed on the growth substrate 180 and the dislocation-controlling features 172. Due to a lattice mismatch and different thermal expansion coefficients between the growth substrate 180 and the buffer layer 190, a tensile stress may be produced. The tensile stress is produced especially in the places where the dislocation-controlling features 172 located, and thus threading dislocations 174 is apt to obliquely originate from the dislocation-controlling features 172. A combination of the growth substrate 180 and the dislocation-controlling features 172 may be a patterned sapphire substrate. In some embodiments, the growth substrate 180 may be made of, for example, Si, SiC, ZnO, InP, AlN, GaP, GaN, or GaAs. The buffer layer 190 may be made of a doped or undoped material such as GaN, AlN, AlGaN, InGaN, InAlGaN, or AlGaInP.

The method 400 continues with operation 420 in which a second type semiconductor layer 120, an active layer 130, and a first type semiconductor layer 110 are sequentially grown on the dislocation-controlling feature 172. In some embodiments which can be illustrated by FIG. 7, the second type semiconductor layer 120 and the ELOG layer 170 may be formed in the same process or different processes. Since the dislocation-controlling features 172 are capable of blocking (see FIG. 7) or controlling (see FIG. 8) the threading dislocations 174 from growing into upper layers, a first region R1 and at least one second region R2 are formed in the active layer 130. In some embodiments, the active layer 130 has a first region R1 and a plurality of second regions R2. Vertical projections of the threading dislocations 174 on the active layer 130 at least partially overlap with the first region R1. As such, each of the second regions R2 has a threading dislocation density less than that of the first region R1. Therefore, the threading dislocation density of the first region R1 is greater than that of the second regions R2. In other words, a vertical projection of one of the dislocation-controlling features 172 on the active layer 130 at least partially overlaps with one of the second regions R2.

In some embodiments, a current control layer 160 is grown during the operation 420. The current control layer 160 may be located between a top surface 1142 of the first type semiconductor layer 110 and an interface between the second type semiconductor layer 120 and an epitaxial lateral overgrowth (ELOG) layer 170. Alternatively, the current control layer 160 may be located between a top surface 1142 of the first type semiconductor layer 110 and an interface between the second type semiconductor layer 120 and an buffer layer 190 (FIG. 8). Although in FIGS. 7 and 8 there is one current control layer 160 present within the second type semiconductor layer 120, it should not be limited thereto. In some other embodiments, there may be a plurality of current control layers 160 present within/on the first type semiconductor layer 110, the second type semiconductor layer 120, or the combination thereof. The current control layers 160 may also be present on an interface between the first type semiconductor layer 110 and the active layer 130, an interface between the active layer 130 and the second type semiconductor layer 120, an interface between the second type semiconductor layer 120 and the ELOG layer 170 (FIG. 7), and an interface between the second type semiconductor layer 120 and the buffer layer 190 (FIG. 8). As shown in embodiments illustrated by FIGS. 7 and 8, the current control layer 160 has a plurality of openings 162 thereon, and a vertical projection of one of the openings 162 on the active layer 130 at least partially overlap with one of the second regions R2.

The method continues with operation 430 in which a resistivity of the first type semiconductor layer 110 is modified, so that the resistivity of the first type semiconductor layer 110 increases from a plurality of low resistance portions 112 toward a high resistance portion 114 of the first type semiconductor layer 110. The modification may be performed after the second type semiconductor layer 120, the active layer 130, and the first type semiconductor layer 110 are grown, but should not be limited thereto.

Specifically, in some embodiments, the low resistance portions 112 and the high resistance portion 114 of the first type semiconductor layer 110 may be formed with assistance of a mask layer having a plurality of openings thereon. The openings of the mask layer correspond to the low resistance portions 112. A covered portion of the mask corresponds to the high resistance portion 114. In some embodiments, the mask layer may be made of metal, such as titanium (Ti). Then, a heating process is performed, and an interaction involving nitrogen vacancy may occur to form titanium nitride ($TiN_x$) on the first type semiconductor layer 110. The nitrogen vacancies may be formed in a portion of the first type semiconductor layer 110 with Ti thereon. Therefore, the high resistance portion 114 (corresponding to the covered portion) may have a nitrogen vacancy density higher than that of the low resistance portions 112 (corresponding to the openings of the mask layer). Accordingly, the resistivity of the first type semiconductor layer 110 increases from the low resistance portions 112 toward the high resistance portion 114. After the above heating process, the mask layer can be removed, and the first electrodes 140 may be formed on the first type semiconductor layer 110, such as respectively on the low resistance portions 112. As a result, vertical projections of one of the openings 162, one of the low resistance portions 112, and one of the dislocation-controlling features 172 on the active layer 130 at least partially overlaps with one of the second regions R2.

In summary, with adequate overlap between vertical projections of low resistance portions of a semiconductor layer, low threading-dislocation density regions of an active layer, and/or an opening of a current control layer, an external quantum efficiency of a light emitting device can be greatly enhanced as illustrated in the above embodiments of the present disclosure. Besides, a plurality of low resistance portions of a first type semiconductor layer with a plurality of electrically isolated first electrodes, a common second type semiconductor layer and a common second electrode enable a digital control on a single light emitting device. The single light emitting device may act as multiple light emitting diodes. This configuration may be applied to, for example, a micro-LED display, such that it is easier to control the brightness of each micro-LED of the micro-LED display.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for manufacturing a light emitting device, comprising:

preparing a growth substrate with at least one dislocation-controlling feature thereon;

sequentially growing a second type semiconductor layer, an active layer, and a first type semiconductor layer on the dislocation-controlling feature, so that the active layer has a first region and at least one second region, wherein a threading dislocation density of the first region is greater than a threading dislocation density of the second region; and modifying a resistivity of the first type semiconductor layer, so that the resistivity of the first type semiconductor layer increases from a plurality of low resistance portions toward a high resistance portion of the first type semiconductor layer, and a vertical projection of at least one of the low resistance portions on the active layer at least partially overlaps with the second region.

2. The method of claim 1, wherein the growing further comprises growing a current control layer located between a top surface of the first type semiconductor layer facing away from the active layer and a side of the second type semiconductor layer opposite to the first type semiconductor layer, the current control layer has a plurality of openings thereon, and a vertical projection of one of the openings on the first type semiconductor layer at least partially overlap with one of the low resistance portions.

3. The method of claim 1, wherein the modifying the resistivity of the first type semiconductor layer is performed after the growing the second type semiconductor layer, the active layer, and the first type semiconductor layer.

4. The method of claim 1, wherein the preparing further comprises forming a buffer layer, wherein the buffer layer is present between the growth substrate and the dislocation-controlling feature, or the dislocation-controlling feature is present between the growth substrate and the buffer layer.

* * * * *